United States Patent
Wu (10) Patent No.: US 12,125,557 B2
(45) Date of Patent: Oct. 22, 2024

(54) ELECTRONIC DEVICE, MEMORY DEVICE, AND WRITE LEVELING METHOD THEREOF

(71) Applicant: NANYA TECHNOLOGY CORPORATION, New Taipei (TW)

(72) Inventor: Shun-Ke Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 147 days.

(21) Appl. No.: 18/164,570

(22) Filed: Feb. 4, 2023

(65) Prior Publication Data

US 2024/0265955 A1    Aug. 8, 2024

(51) Int. Cl.
    G11C 11/4093    (2006.01)
    G11C 7/10       (2006.01)
    G11C 7/22       (2006.01)

(52) U.S. Cl.
    CPC ............ *G11C 7/222* (2013.01); *G11C 7/1093* (2013.01); *G11C 7/1096* (2013.01)

(58) Field of Classification Search
    CPC .................................................. G11C 11/4093
    See application file for complete search history.

(56) References Cited

U.S. PATENT DOCUMENTS 11,500,795 B2 * 11/2022 Chung ................ G11C 11/4093
2015/0243343 A1    8/2015 Giovannini et al.

OTHER PUBLICATIONS

"Office Action of Taiwan Counterpart Application", issued on Mar. 18, 2024, p. 1-p. 9.

* cited by examiner

*Primary Examiner* — Jason Lappas
(74) *Attorney, Agent, or Firm* — JCIPRNET (57) ABSTRACT

An electronic device, a memory device of the electronic device, and a write leveling method of the memory device are provided. The memory device is coupled to a memory controller to receive a data strobe signal DQS and a clock signal CLK. In a write leveling mode, the memory device provides a write leveling function to the memory controller, where the write leveling function includes a plurality of iterative operations. In each of the iterative operations, the memory controller sends a notification to the memory device, and the memory device sets up a strobe window based on the notification. The memory device samples the clock signal CLK based on a phase of the data strobe signal DQS in the strobe window, so as to send a sampling result back to the memory controller. The memory device is prohibited from sampling the clock signal CLK outside the strobe window.

27 Claims, 4 Drawing Sheets

ELECTRONIC DEVICE, MEMORY DEVICE, AND WRITE LEVELING METHOD THEREOF

BACKGROUND

Technical Field

The disclosure relates to an electronic device; more particularly, the disclosure relates to a memory device and a write leveling method thereof.

Description of Related Art

Compared with a conventional synchronous dynamic random access memory (SDRAM), a double data rate (DDR) SDRAM has a double data transmission rate. Ever since the third-generation DDR memory (DDR3), a method of transmitting control signals, such as a clock signal CLK, a command CMD, and an address ADDR, has been changed to adopt fly-by architectures, while a data strobe signal DQS and a data signal DQ are still transmitted by adopting point-to-point architectures. In the fly-by architecture, after a control signal is sent from a memory controller, the control signal reaches the first DDR memory, the second DDR memory, and then the third DDR memory (and the rest may be deduced therefrom). Due to the nature of the fly-by architecture, the time at which the control signal arrives at respective DDR memories may be different.

Starting from the DDR3, SDRAM is able to provide a write leveling function to solve an issue of signal skew during transmission caused by the fly-by architecture. The write leveling function may include a calibration of the clock signal CLK by the data strobe signal DQS. During the initial system setup, the memory controller allows the DDR memory to enter a write leveling mode first and transmits the data strobe signal DQS and the clock signal CLK to the DDR memory. The DDR memory in the write leveling mode unconditionally samples the clock signal CLK by applying a rising edge of the data strobe signal DQS and sends a sampling result back to the memory controller through a transmission channel of the data signal DQ.

After entering the write leveling mode, the memory controller continues to send the clock signal CLK. The memory controller also sends a pulse of the data strobe signal DQS to the DDR memory and then observes the data signal DQ sent back by the DDR memory (based on the sampling result of the clock signal CLK obtained by applying the data strobe signal DQS). The memory controller constantly adjusts a pulse time (a phase) of the data strobe signal DQS and then observes changes to the data signal DQ sent back by the DDR memory. Said operations are repeated until the data signal DQ sent back by the DDR memory is transformed from 0 to 1, which means that a rising edge of the clock signal CLK is already aligned to the rising edge of the data strobe signal DQS, and thus the write levelling calibration is completed.

Ideally, after the write leveling calibration process is completed, the rising edge of the data strobe signal DQS should be aligned to a certain target rising edge (the correct rising edge) of the clock signal CLK. However, based on different layouts of circuit boards and different operational environments, the time difference (the phase difference) between the clock signal CLK and the data strobe signal DQS may exceed 1 period or 1 cycle of the clock signal CLK. That is, after the write leveling calibration process is completed, the rising edge of the data strobe signal DQS may be aligned to an incorrect rising edge of the clock signal CLK (other rising edges earlier or later than the target rising edge). How to ensure that the rising edge of the data strobe signal DQS is aligned to the target rising edge (the correct rising edge) of the clock signal CLK in the write leveling calibration process is one of many technical issues in this field.

It should be noted that the content of the "Description of Related Art" section is used to help understand the disclosure. Some of the content (or all of the content) disclosed in the "Description of Related Art" section may not be known by those of ordinary skill in the art. The content disclosed in the "Description of Related Art" section does not mean that the content has been known to those with ordinary knowledge in the technical field before the application of the disclosure.

SUMMARY

The disclosure provides an electronic device, a memory device of the electronic device, and a write leveling method of the memory device are provided, so as to correctly perform write leveling calibrations.

In an embodiment of the disclosure, the memory device includes an interface circuit, a core circuit, and a write leveling circuit. The interface circuit is configured to be coupled to a memory controller located outside the memory device. The core circuit is coupled to the interface circuit. In a normal operation mode, the core circuit provides a memory access function to the memory controller through the interface circuit. The write leveling circuit is coupled to the interface circuit. In a write leveling mode, the write leveling circuit provides a write leveling function to the memory controller through the interface circuit, where the write leveling function includes a plurality of iterative operations. The write leveling circuit sets up a strobe window in each of the iterative operations, samples a clock signal CLK coming from the memory controller based on a phase of a data strobe signal DQS coming from the memory controller in the strobe window to send a sampling result back to the memory controller, and prohibits sampling the clock signal CLK outside the strobe window.

In an embodiment of the disclosure, the write leveling method includes: setting up a strobe window in each of a plurality of iterative operations of a write leveling function; in the strobe window, sampling a clock signal CLK coming from a memory controller based on a phase of a data strobe signal DQS coming from the memory controller, so as to send a sampling result back to the memory controller; prohibiting sampling the clock signal CLK outside the strobe window.

In an embodiment of the disclosure, the electronic device includes a memory controller and a memory device. The memory device is coupled to the memory controller to receive a data strobe signal DQS and a clock signal CLK. In a write leveling mode, the memory device provides a write leveling function to the memory controller, where the write leveling function includes a plurality of iterative operations. In each of the iterative operations, the memory controller sends a notification to the memory device, and the memory device sets up a strobe window based on the notification. The memory device samples the clock signal CLK based on a phase of the data strobe signal DQS in the strobe window, so as to send a sampling result back to the memory controller. The memory device prohibits sampling the clock signal CLK outside the strobe window.

In view of the above, the memory controller provided in one or more embodiments of the disclosure may send the notification to the memory device in each of the iterative operations of the write leveling calibration process. In different embodiments, the notification may be a physical pin signal, any command (such as a write command, Write CMD) that is regulated in the DDR memory standard, or a customized command that is not regulated in the DDR memory standard. In each iterative operation, the memory device may set up the strobe window based on the notification of the memory controller. The strobe window covers the target time point of the target rising edge of the clock signal CLK. The memory device is prohibited from sampling the clock signal CLK outside the strobe window, and the memory device samples the clock signal CLK in the strobe window based on the phase of the data strobe signal DQS. Therefore, the memory device is able to ensure that the rising edge of the data strobe signal DQS is aligned to the target rising edge (the correct rising edge) of the clock signal CLK in the write leveling calibration process.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The terminologies "couple (or connect)" used throughout the whole description of the disclosure (including the claims) may refer to any direct or indirect connection means. For instance, if the disclosure describes that a first device is coupled (or connected) to a second device, it should be interpreted that the first device may be directly connected to the second device, or that the first device may be indirectly connected to the second device through other devices or certain connection means. The terminologies such as "first" and "second" mentioned in the description of the disclosure (including the claims) are only used to name different elements or to distinguish different embodiments or scopes and are not intended to limit the upper or lower limit of the number of the elements, nor are they intended to limit the manufacturing order or disposition order of the elements. Moreover, wherever possible, elements/components/steps with the same reference numbers in the drawings and the embodiments denote the same or similar parts. Cross-reference may be made to related descriptions of elements/components/steps with the same reference numbers or the same terminologies in different embodiments.

Figure 1:
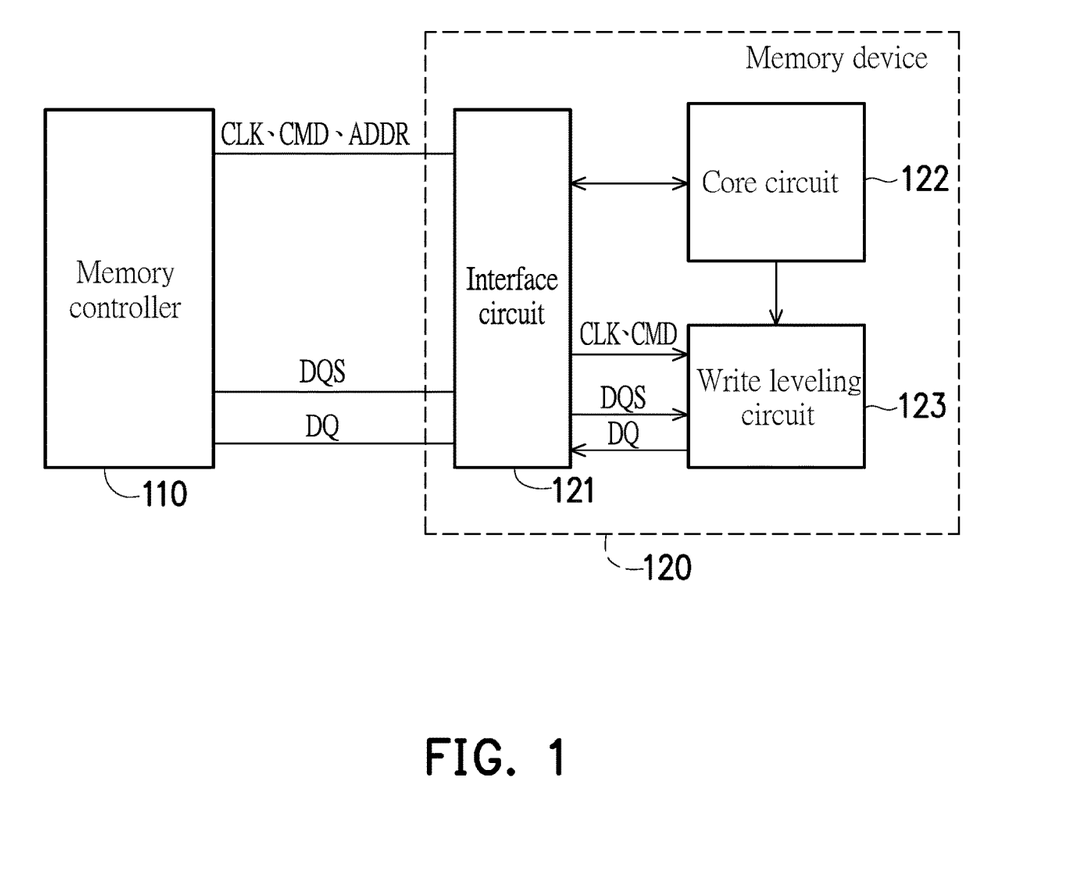
FIG. 1 is a schematic circuit block view of an electronic device according to an embodiment of the disclosure.

FIG. 1 is a schematic circuit block view of an electronic device according to an embodiment of the disclosure. The electronic device shown in FIG. 1 includes a memory controller 110 and a memory device 120. The memory device 120 is coupled to the memory controller 110 to receive control signals (such as a clock signal CLK, a command CMD, an address ADDR, etc.) and data (such as a data strobe signal DQS and a data signal DQ). The memory device 120 may provide a write leveling function to solve the issue of signal skew during transmission caused by the fly-by architecture. During the initial system setup, the memory controller 110 may perform the write leveling function to calibrate a phase of the data strobe signal DQS based on the clock signal CLK.

When the memory controller 110 performs the write leveling function, the memory controller 110 may trigger the memory device 120 to enter a write leveling mode. In the write leveling mode, the memory device 120 may provide the write leveling function to the memory controller 110, where the write leveling function includes a plurality of iterative operations. In each iterative operation, the memory controller 110 may send a notification to the memory device 120, and the memory device 120 may setup a strobe window based on the notification of the memory controller 110. According to the actual design, in different embodiments, the notification of the memory controller 110 may be a physical pin signal, any command (such as a Write CMD) regulated by the DDR memory standard, or a customized command not regulated by the DDR memory standard. The write command (hereinafter referred to as the Write CMD) regulated by the DDR memory standard serves as a specific example of the notification in the following embodiments.

In each iterative operation, the memory device 120 may set up the strobe window based on the notification of the memory controller 110. The strobe window covers a target time point of a target rising edge (the correct rising edge) of the clock signal CLK and does not cover a non-target rising edge of the clock signal CLK (another rising edge earlier or later than the target rising edge). The memory device 120 is prohibited from sampling the clock signal CLK outside the strobe window, and the memory device 120 may sample the clock signal CLK in the strobe window based on a phase of the data strobe signal DQS, so as to send a sampling result back to the memory controller 110. Therefore, the memory device 120 is able to ensure that the rising edge of the data strobe signal DQS in the write leveling calibration process is aligned to the target rising edge (the correct rising edge) of the clock signal CLK rather than being aligned to the non-target rising edge (the incorrect rising edge) of the clock signal CLK.

In the embodiment shown in FIG. 1, the memory device 120 includes an interface circuit 121, a core circuit 122, and a write leveling circuit 123. The interface circuit 121 is configured to be coupled to the memory controller 110 located outside the memory device 120. The core circuit 122 is coupled to the interface circuit 121. The core circuit 122 may include a plurality of memory cells (memory cells) and relevant management circuits. In a normal operation mode, the core circuit 122 may provide a memory access function to the memory controller 110 through the interface circuit 121. The implementation details of the interface circuit 121 and the core circuit 122 are not limited in this embodiment. According to the actual design, in some embodiments, the interface circuit 121 may be any transmission interface circuit conforming to the DDR memory standard, and the core circuit 122 may be any memory core circuit conforming to the DDR memory standard.

When the memory controller 110 performs the write leveling function, the memory controller 110 may trigger the memory device 120 to enter the write leveling mode. That is, based on the trigger operation of the memory controller 110, the core circuit 122 enables the write leveling circuit 123. After the write leveling mode ends, for instance, in the normal operation mode, the core circuit 122 may disable the write leveling circuit 123.

The memory controller 110 continuously sends the clock signal CLK to the interface circuit 121. The write leveling circuit 123 is coupled to the interface circuit 121. When the write leveling circuit 123 is enabled, the write leveling circuit 123 may receive the clock signal CLK, the command CMD (the notification, such as the Write CMD), and the data strobe signal DQS from the memory controller 110 through the interface circuit 121. In the write leveling mode, the write leveling circuit 123 may sample the clock signal CLK by conditionally applying the rising edge of the data strobe signal DQS and send a sampling result back to the memory controller 110 through the transmission channel of the data signal DQ.

The memory controller 110 sends the pulse of the data strobe signal DQS to the write leveling circuit 123 and then observes the data signal DQ sent back by the write leveling circuit 123 (based on the sampling result of the clock signal CLK obtained by applying the data strobe signal DQS). At this time, one iterative operation of the write leveling function is completed. In different iterative operations, the memory controller 110 continuously adjusts the pulse time (the phase) of the data strobe signal DQS and then observes changes to the data signal DQ sent back by the leveling circuit 123. After undergoing a plurality of iterative operations, the memory controller 110 may determine/decide a calibration quantity of the pulse time (the phase) of the data strobe signal DQS based on logic changes to the data signal DQ sent back by the write leveling circuit 123, whereby the write leveling calibration process is completed. After the memory controller 110 adjusts/calibrates the pulse time (the phase) of the data strobe signal DQS according to the correct calibration quantity, the rising edge of the data strobe signal DQS received by the memory device 120 may be aligned to the target rising edge of the clock signal CLK received by the memory device 120.

Figure 2:
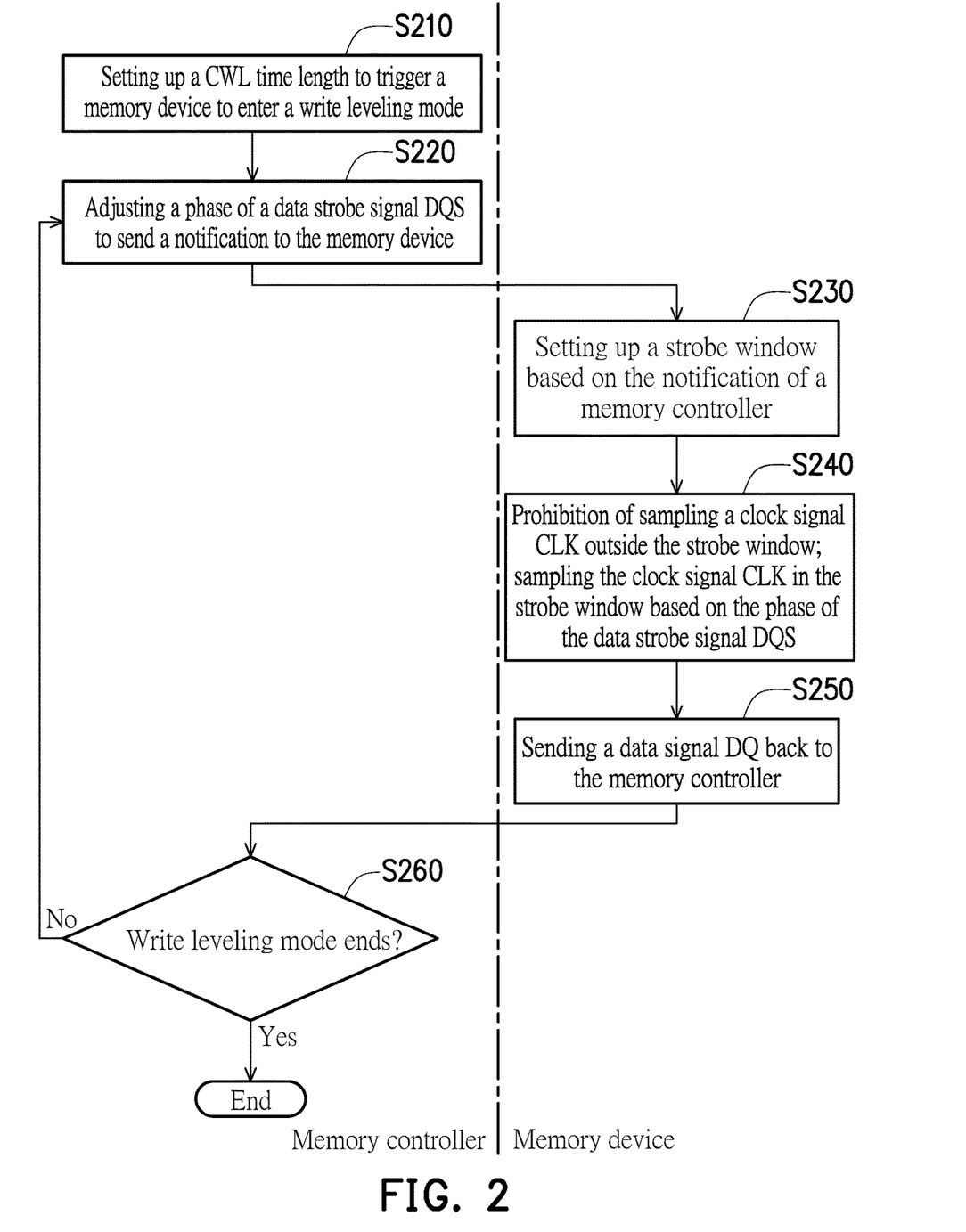
FIG. 2 is a schematic flowchart of a write leveling method of a memory device according to an embodiment of the disclosure.

FIG. 2 is a schematic flowchart of a write leveling method of a memory device according to an embodiment of the disclosure. With reference to FIG. 1 and FIG. 2, in step S210, the memory controller 110 may set up a "CAS write latency (CWL)" time length for the memory device 120. Here, "CAS" refers to "column address strobe", and the "CWL" time length is a length of a delay time between a column address and written data. The CWL time length is regulated in the DDR memory standard. Therefore, no further descriptions will be provided hereinafter. The memory controller 110 triggers the memory device 120 to enter the write leveling mode in step S210, so as to enable the write leveling circuit 123. In the write leveling mode, the write leveling circuit 123 may provide the write leveling function to the memory controller 110 through the interface circuit 121, where the write leveling function includes a plurality of iterative operations (step S220 to step S260 are directed to one iterative operation). After step S210 is completed, the memory controller 110 and the memory device 120 jointly perform the iterative operation repetitively. In different iterative operations, the memory controller 110 may continuously adjust the pulse time (the phase) of the data strobe signal DQS and then observe changes to the data signal DQ sent back by the write leveling circuit 123.

In step S220, the memory controller 110 adjusts the pulse time (the phase) of the data strobe signal DQS and sends a notification (such as a Write CMD) to the write leveling circuit 123 of the memory device 120. In step S230, the write leveling circuit 123 may set up a strobe window SW in each iterative operation based on the notification of the memory controller 110.

Figure 3:
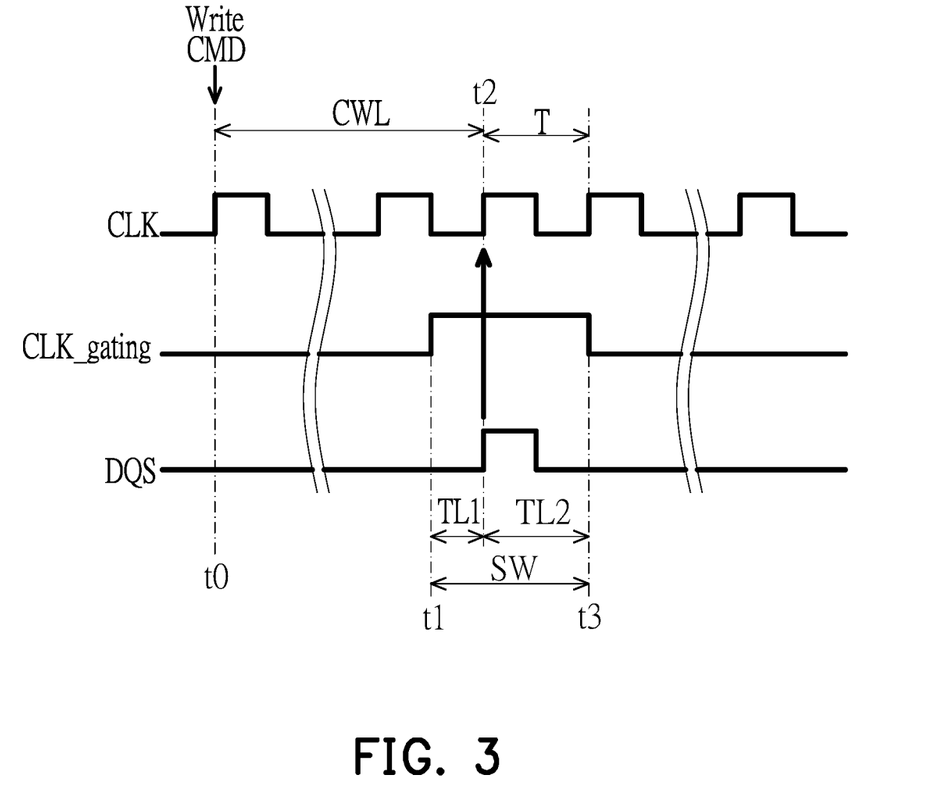
FIG. 3 is a schematic timing diagram of a clock signal and a data strobe signal according to an embodiment of the disclosure.

FIG. 3 is a schematic timing diagram of a clock signal and a data strobe signal according to an embodiment of the disclosure. The horizontal axis in FIG. 3 represents time. Based on the regulations of the DDR memory standard, the rising edge of the data strobe signal DQS should be aligned to a certain target rising edge (the correct rising edge) of the clock signal CLK. A target time point of the target rising edge is counted from a time point t0 at which the memory device 120 receives the command CMD (the notification of the memory controller 110) until reaching the CWL time length at a time point t2, as shown in FIG. 3. The write levelling circuit 123 may set up the strobe window SW based on the notification of the memory controller 110 (such as the Write CMD). The strobe window SW covers the target time point t2 of the target rising edge (the correct rising edge) of the clock signal CLK and does not cover the non-target rising edge of the clock signal CLK (another rising edge earlier or later than the target rising edge). In the embodiment shown in FIG. 3, a duration of the strobe window SW is less than or equal to 1.5 cycles T of the clock signal CLK. A duration TL1 from the start time point t1 of the strobe window SW to the target time point t2 of the target rising edge is greater than 0 and less than or equal to 0.5 cycle T of the clock signal CLK, and a duration TL2 from the target time point t2 of the target rising edge to an end time point t3 of the strobe window SW is greater than 0 and less than or equal to 1 cycle T of the clock signal CLK.

Starting from the DDR3, the transmission paths of the control signals, such as the clock signal CLK, the command CMD, and the address ADDR, adopt a fly-by architecture, while the transmission paths of the data strobe signal DQS and the data signal DQ adopt a point-to-point architecture. The fly-by architecture may lead to the issue of signal skew during transmission of the clock signal CLK and the data strobe signal DQS (the data signal DQ). The memory controller 110 and the write leveling circuit 123 may apply the write leveling method shown in FIG. 2. Through the iterative operations shown in FIG. 2, the memory controller 110 may determine/decide the calibration quantity of the pulse time (the phase) of the data strobe signal DQS. After the memory controller 110 adjusts/calibrates the pulse time (the phase) of the data strobe signal DQS according to the correct calibration quantity, the rising edge of the data strobe signal DQS received by the memory device 120 is able to be aligned to the target rising edge (the correct rising edge) of the clock signal CLK received by the memory device 120.

With reference to FIG. 1, FIG. 2, and FIG. 3, the write leveling circuit 123 in the strobe window SW may sample the clock signal CLK based on the phase of the data strobe signal DQS (step S240), and then the write leveling circuit 123 sends a sampling result back to the memory controller 110 through a transmission channel of the data signal DQ (step S250). It should be noted that in the write leveling mode, the write leveling circuit 123 samples the clock signal CLK by conditionally applying the rising edge of the data strobe signal DQS. That is, the write leveling circuit 123 is prohibited from sampling the clock signal CLK outside the strobe window SW. The strobe window SW may shield/prevent a false sampling of the non-target rising edge of the clock signal CLK. Therefore, after completing the iterative operations shown in FIG. 2, the write leveling circuit 123 is able to ensure that the rising edge of the data strobe signal DQS is aligned to the target rising edge (the correct rising edge) of the clock signal CLK in the write leveling calibration process.

In step S260, the memory controller 110 determines whether to end the write leveling mode. At this time, one iterative operation included in the write leveling function is completed. In each iterative operation, the write leveling circuit 123 may set up the strobe window SW based on the notification of the memory controller 110, and the write leveling circuit 123 may conditionally (in the strobe window SW) sample the clock signal CLK based on the phase of the data strobe signal DQS, so as to send the sampling result (the data signal DQ) back to the memory controller 110. The memory controller 110 observes the data signal DQ sent back by the write leveling circuit 123 (based on the sampling result of the clock signal CLK obtained by applying the data strobe signal DQS) to determine whether the rising edge of the data strobe signal DQS received by the memory device 120 is aligned to the target rising edge of the clock signal CLK received by the memory device 120.

When the memory controller 110 determines that the rising edge of the data strobe signal DQS received by the memory device 120 is not aligned to the target rising edge of the clock signal CLK received by the memory device 120 (the determination result in step S260 is "No"), the memory controller 110 returns to step S220 to perform the iterative operation again. In different iterative operations, the memory controller 110 continuously adjusts the pulse time (the phase) of the data strobe signal DQS and then observes changes to the data signal DQ sent back by the write leveling circuit 123.

After undergoing the iterative operations, the memory controller 110 is able to determine/decide the calibration quantity of the pulse time (the phase) of the data strobe signal DQS based on logic changes to the data signal DQ sent back by the write leveling circuit 123, so as to complete the write leveling calibration process (the write leveling mode). After the memory controller 110 adjusts/calibrates the pulse time (the phase) of the data strobe signal DQS according to the correct calibration quantity, the rising edge of the data strobe signal DQS received by the memory device 120 may be aligned to the target rising edge of the clock signal CLK received by the memory device 120. After the write leveling mode ends (the determination result in step S260 is "Yes"), the core circuit 122 may disable the write leveling circuit 123, so that the core circuit 122 provides the memory access function to the memory controller 110.

Figure 4:
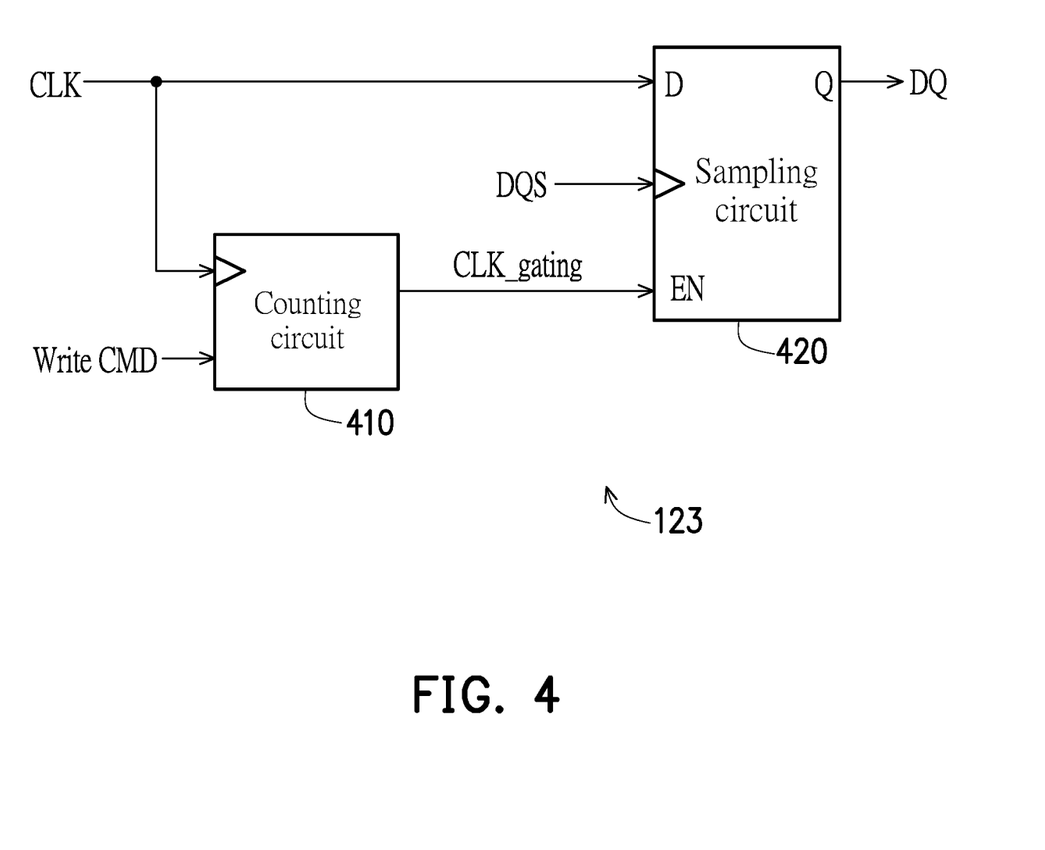
FIG. 4 is a schematic circuit block view of a write leveling circuit according to an embodiment of the disclosure.

FIG. 4 is a schematic circuit block view of a write leveling circuit according to an embodiment of the disclosure. The write leveling circuit 123 shown in FIG. 4 may serve as one of many exemplary embodiments of the write leveling circuit 123 shown in FIG. 1. In the embodiment shown in FIG. 4, the write leveling circuit 123 includes a counting circuit 410 and a sampling circuit 420. The counting circuit 410 may receive the notification (such as the Write CMD) from the memory controller 110 and the clock signal CLK through the interface circuit 121. Based on the notification of the memory controller 110, the counting circuit 410 may count the pulse of the clock signal CLK and generate a clock gating signal CLK_gating, where the clock gating signal CLK_gating may define the strobe window SW, as shown in FIG. 3.

For instance, when the notification (such as the Write CMD) of the memory controller 110 arrives at the counting circuit 410, the counting circuit 410 starts to count the pulse of the clock signal CLK from an initial value (such as 0 or any value) and obtains a count value. When the count value indicates that a duration from a counting time point t0 at which the notification (such as the Write CMD) arrives at the counting circuit 410 to a current time point has reached a time length obtained by subtracting an advance time length TL1 from the CWL time length, the counting circuit 410 transforms the clock gating signal CLK_gating from a disabled state to an enabled state (e.g., from logic 0 to logic 1). Here, the advance time length TL1 is greater than 0 and less than or equal to 0.5 cycle T of the clock signal CLK. When the count value indicates that a duration from the counting time point t0 to the current time point has reached a time length obtained by adding a delay time length TL2 to the CWL time length, the counting circuit 410 transforms the clock gating signal CLK_gating from the enabled state to the disabled state (e.g., from logic 1 to logic 0). Here, the delay time length TL2 is greater than 0 and less than or equal to 1 cycle T of the clock signal CLK.

A trigger terminal of the sampling circuit 420 may receive the data strobe signal DQS from the memory controller 110 through the interface circuit 121. A data input terminal D of the sampling circuit 420 may receive the clock signal CLK from the memory controller 110 through the interface circuit 121. An enabling terminal EN of the sampling circuit 420 is coupled to the counting circuit 410 to receive the clock gating signal CLK_gating. When the clock gating signal CLK_gating is disabled (such as logic 0, indicating that the current time point is outside the strobe window SW), the sampling circuit 420 is disabled. Therefore, the clock gating signal CLK_gating may shield/prevent false sampling of the non-target rising edge of the clock signal CLK by the sampling circuit 420.

When the clock gating signal CLK_gating is in the enabled state (such as logic 1, indicating that the current time point is in the strobe window SW), the sampling circuit 420 may sample the clock signal CLK based on the trigger operation of the data strobe signal DQS. For instance, when a rising edge occurs on the data strobe signal DQS, the sampling circuit 420 may sample the clock signal CLK to generate a sampling result. A data output terminal Q of the sampling circuit 420 may send the sampling result (the data signal DQ) back to the memory controller 110 through the interface circuit 121.

To sum up, the memory controller 110 provided in one or more embodiments of the disclosure may send the notification to the counting circuit 410 of the write leveling circuit 123 in each iterative operation of the write leveling calibration process. In different embodiments, the notification may be a physical pin signal, any command (such as a Write CMD) that is regulated in the DDR memory standard, or a customized command that is not regulated in the DDR memory standard. In each iterative operation, the counting circuit 410 may generate the clock gating signal CLK_gating pulse (i.e., setting the strobe window SW) based on the notification of the memory controller 110. The pulse of the clock gating signal CLK_gating covers the target time point t2 of the target rising edge of the clock signal CLK. The sampling circuit 420 of the write leveling circuit 123 is prohibited from sampling the clock signal CLK outside the pulse period of the clock gating signal CLK_gating, and during the pulse period of the clock gating signal CLK_gating, the write leveling circuit 120 samples the clock signal CLK based on the phase of the data strobe signal DQS. Therefore, the counting circuit 410 is able to ensure that the rising edge of the data strobe signal DQS is aligned to the target rising edge (the correct rising edge) of the clock signal CLK in the write leveling calibration process and is not aligned to the non-target rising edge of the clock signal CLK (the incorrect rising edge).

It will be apparent to those skilled in the art that various modifications and variations may be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A memory device, comprising:
an interface circuit, configured to be coupled to a memory controller located outside the memory device;
a core circuit, coupled to the interface circuit, wherein in a normal operation mode, the core circuit provides a memory access function to the memory controller through the interface circuit; and
a write leveling circuit, coupled to the interface circuit, wherein in a write leveling mode, the write leveling circuit provides a write leveling function to the memory controller through the interface circuit, the write leveling function comprises a plurality of iterative operations, and the write leveling circuit sets up a strobe window in each of the iterative operations, samples a clock signal coming from the memory controller based on a phase of a data strobe signal coming from the memory controller in the strobe window to send a sampling result back to the memory controller, and is prohibited from sampling the clock signal outside the strobe window.

2. The memory device according to claim 1, wherein the write leveling circuit is disabled in the normal operation mode.

3. The memory device according to claim 1, wherein the strobe window covers a target time point of a target rising edge of the clock signal, and a duration of the strobe window is less than or equal to 1.5 cycles of the clock signal.

4. The memory device according to claim 3, wherein the write leveling circuit sets up the strobe window based on a notification of the memory controller in each of the iterative operations, and the target time point of the target rising edge is counted from the notification of the memory controller until reaching a column address strobe write latency time length.

5. The memory device according to claim 4, wherein the notification comprises a write command.

6. The memory device according to claim 4, wherein a duration from a start time point of the strobe window to the target time point of the target rising edge is less than or equal to 0.5 cycle of the clock signal, and a duration from the target time point of the target rising edge to an end time point of the strobe window is less than or equal to 1 cycle of the clock signal.

7. The memory device according to claim 1, wherein the write leveling circuit comprises:
a counting circuit, configured to receive a notification from the memory controller and the clock signal through the interface circuit, wherein the counting circuit counts a pulse of the clock signal based on the notification to generate a clock gating signal, and the clock gating signal defines the strobe window; and
a sampling circuit, coupled to the counting circuit to receive the clock gating signal, wherein the sampling circuit receives the data strobe signal and the clock signal from the memory controller through the interface circuit,
wherein the sampling circuit is disabled when the clock gating signal indicates that a current time point is outside the strobe window,
the sampling circuit samples the clock signal based on a trigger operation of the data strobe signal when the clock gating signal indicates that the current time point is in the strobe window, and
the sampling circuit sends the sampling result back to the memory controller through the interface circuit.

8. The memory device according to claim 7, wherein when a rising edge occurs on the data strobe signal, the sampling circuit samples the clock signal to generate the sampling result.

9. The memory device according to claim 7, wherein
when the notification arrives at the counting circuit, the counting circuit starts to count the pulse of the clock signal from an initial value and obtains a count value;
when the count value indicates that a duration from a counting time point at which the notification arrives at the counting circuit to the current time point has reached a time length obtained by subtracting an advance time length from a column address strobe write latency time length, the counting circuit transforms the clock gating signal from a disabled state to an enabled state, wherein the advance time length is greater than 0 and less than or equal to 0.5 cycle of the clock signal; and
when the count value indicates that the duration from the counting time point to the current time point has reached a time length obtained by adding a delay time length to the column address strobe write latency time length, the counting circuit transforms the clock gating signal from the enabled state to the disabled state, wherein the delay time length is greater than 0 and less than or equal to 1 cycle of the clock signal.

10. A write leveling method of a memory device, comprising:
setting up a strobe window in each of a plurality of iterative operations of a write leveling function;
sampling a clock signal coming from a memory controller based on a phase of a data strobe signal coming from the memory controller in the strobe window, so as to send a sampling result back to the memory controller; and
being prohibited from sampling the clock signal outside the strobe window.

11. The write leveling method according to claim 10, wherein the strobe window covers a target time point of a target rising edge of the clock signal, and a duration of the strobe window is less than or equal to 1.5 cycles of the clock signal.

12. The write leveling method according to claim 11, further comprising:
setting up the strobe window based on a notification of the memory controller in each of the iterative operations, wherein the target time point of the target rising edge is counted from the notification of the memory controller until reaching a column address strobe write latency time length.

13. The write leveling method according to claim 12, wherein the notification comprises a write command.

14. The write leveling method according to claim 12, wherein a duration from a start time point of the strobe window to the target time point of the target rising edge is less than or equal to 0.5 cycle of the clock signal, and a duration from the target time point of the target rising edge to an end time point of the strobe window is less than or equal to 1 cycle of the clock signal.

15. The write leveling method according to claim 10, further comprising:
- counting, by a counting circuit, a pulse of the clock signal based on a notification of the memory controller to generate a clock gating signal based on a notification from the memory controller, wherein the clock gating signal defines the strobe window;
- disabling a sampling circuit when the clock gating signal indicates that a current time point is outside the strobe window;
- sampling, by the sampling circuit, the clock signal based on a trigger operation of the data strobe signal when the clock gating signal indicates that the current time point is in the strobe window; and
- sending, by the sampling circuit, the sampling result back to the memory controller through the interface circuit.

16. The write leveling method according to claim 15, further comprising:
- sampling the clock signal by the sampling circuit to generate the sampling result when a rising edge occurs on the data strobe signal.

17. The write leveling method according to claim 15, further comprising:
- starting to count the pulse of the clock signal from an initial value by the counting circuit to obtain a count value when the notification arrives at the counting circuit;
- transforming the clock gating signal from a disabled state to an enabled state by the counting circuit when the count value indicates that a duration from a counting time point at which the notification arrives at the counting circuit to the current time point has reached a time length obtained by subtracting an advance time length from a column address strobe write latency time length, wherein the advance time length is greater than 0 and less than or equal to 0.5 cycle of the clock signal; and
- transforming the clock gating signal from the enabled state to the disabled state by the counting circuit when the count value indicates that the duration from the counting time point to the current time point has reached a time length obtained by adding a delay time length to the column address strobe write latency time length, wherein the delay time length is greater than 0 and less than or equal to 1 cycle of the clock signal.

18. An electronic device, comprising:
- a memory controller; and
- a memory device, coupled to the memory controller to receive a data strobe signal and a clock signal, wherein,
- in a write leveling mode, the memory device provides a write leveling function to the memory controller, wherein the write leveling function comprises a plurality of iterative operations;
- in each of the iterative operations, the memory controller sends a notification to the memory device, and the memory device sets up a strobe window based on the notification;
- the memory device samples the clock signal based on a phase of the data strobe signal in the strobe window, so as to send a sampling result back to the memory controller; and
- the memory device is prohibited from sampling the clock signal outside the strobe window.

19. The electronic device according to claim 18, wherein the strobe window covers a target time point of a target rising edge of the clock signal, and a duration of the strobe window is less than or equal to 1.5 cycles of the clock signal.

20. The electronic device according to claim 19, wherein the target time point of the target rising edge is counted from the notification of the memory controller until reaching a column address strobe write latency time length.

21. The electronic device according to claim 20, wherein the notification comprises a write command.

22. The electronic device according to claim 20, wherein a duration from a start time point of the strobe window to the target time point of the target rising edge is less than or equal to 0.5 cycle of the clock signal, and a duration from the target time point of the target rising edge to an end time point of the strobe window is less than or equal to 1 cycle of the clock signal.

23. The electronic device according to claim 18, wherein the memory device comprises:
- an interface circuit, coupled to the memory controller;
- a core circuit, coupled to the interface circuit, wherein in a normal operation mode, the core circuit provides a memory access function to the memory controller through the interface circuit; and
- a write leveling circuit, coupled to the interface circuit, wherein in the write leveling mode, the write leveling circuit provides the write leveling function to the memory controller through the interface circuit, and the write leveling circuit sets up the strobe window in each of the iterative operations based on the notification, samples the clock signal based on the phase of the data strobe signal in the strobe window to send the sampling result back to the memory controller, and is prohibited from sampling the clock signal outside the strobe window.

24. The electronic device according to claim 23, wherein the write levelling circuit is disabled in the normal operation mode.

25. The electronic device according to claim 23, wherein the write leveling circuit comprises:
- a counting circuit, configured to receive the notification and the clock signal from the memory controller through the interface circuit, wherein the counting circuit counts a pulse of the clock signal based on the notification to generate a clock gating signal, and the clock gating signal defines the strobe window; and
- a sampling circuit, coupled to the counting circuit to receive the clock gating signal, wherein the sampling circuit receives the data strobe signal and the clock signal from the memory controller through the interface circuit,
- wherein when the clock gating signal indicates that a current time point is outside the strobe window, the sampling circuit is disabled,
- when the clock gating signal indicates that the current time point is in the strobe window, the sampling circuit samples the clock signal based on a trigger operation of the data strobe signal, and
- the sampling circuit sends the sampling result back to the memory controller through the interface circuit.

26. The electronic device according to claim 25, wherein when a rising edge occurs on the data strobe signal, the sampling circuit samples the clock signal to generate the sampling result.

27. The electronic device according to claim 25, wherein
when the notification arrives at the counting circuit, the counting circuit starts to count the pulse of the clock signal from an initial value and obtains a count value;
the counting circuit transforms the clock gating signal from a disabled state to an enabled state when the count value indicates that a duration from a counting time point at which the notification arrives at the counting circuit to the current time point has reached a time length obtained by subtracting an advance time length from a column address strobe write latency time length, wherein the advance time length is greater than 0 and less than or equal to 0.5 cycle of the clock signal; and
the counting circuit transforms the clock gating signal from the enabled state to the disabled state when the count value indicates that the duration from the counting time point to the current time point has reached a time length obtained by adding a delay time length to the column address strobe write latency time length, wherein the delay time length is greater than 0 and less than or equal to 1 cycle of the clock signal.

* * * * *